United States Patent [19]

Heimeier et al.

[11] 4,330,853

[45] May 18, 1982

[54] METHOD OF AND CIRCUIT ARRANGEMENT FOR READING AND/OR WRITING AN INTEGRATED SEMICONDUCTOR STORAGE WITH STORAGE CELLS IN MTL (I²L) TECHNOLOGY

[75] Inventors: Helmut H. Heimeier, Herrenberg; Wielfried Klein, Holzerlingen; Erich Klink; Friedrich C. Wernicke, both of Schoenaich, all of Fed. Rep. of Germany

[73] Assignee: International Business Machines Corporation, Armonk, N.Y.

[21] Appl. No.: 136,859

[22] Filed: Apr. 3, 1980

[30] Foreign Application Priority Data

Jun. 28, 1979 [DE] Fed. Rep. of Germany ....... 2926050

[51] Int. Cl.³ .......................................... G11C 11/40
[52] U.S. Cl. .................................. 365/227; 365/149; 365/189
[58] Field of Search .............. 365/227, 226, 149, 154, 365/189

[56] References Cited

U.S. PATENT DOCUMENTS

| | | | |
|---|---|---|---|
| 3,540,010 | 11/1970 | Heightley et al. | 340/173 |
| 3,541,531 | 11/1970 | Iwersen et al. | 340/173 |
| 3,643,231 | 2/1972 | Lohrey et al. | 365/174 |
| 3,668,264 | 8/1972 | Dingwall | 340/173 |
| 3,736,477 | 5/1973 | Berger et al. | 365/174 |
| 3,736,574 | 5/1973 | Gersbach | 340/173 |
| 3,786,422 | 1/1974 | Alexander et al. | 340/173 |
| 3,815,106 | 6/1974 | Wiedmann | 307/291 |
| 3,816,758 | 6/1974 | Berger | 307/214 |
| 3,866,531 | 5/1975 | McNeill | 365/174 |
| 3,900,838 | 8/1975 | Wiedmann | 340/173 |
| 3,993,918 | 11/1976 | Sinclair | 307/279 |
| 4,021,786 | 5/1977 | Peterson | 307/238 |
| 4,032,902 | 6/1977 | Herndon | 340/173 |
| 4,070,656 | 1/1978 | Heuber et al. | 365/203 |
| 4,090,255 | 5/1978 | Berger et al. | 365/174 |
| 4,112,511 | 9/1978 | Heald | 365/188 |
| 4,185,321 | 1/1980 | Iwahashi | 365/227 |

FOREIGN PATENT DOCUMENTS 4871 10/1979 Fed. Rep. of Germany .
13302 7/1980 Fed. Rep. of Germany .

OTHER PUBLICATIONS

"MTL Storage Cell", S. K. Wiedmann, IBM Tech. Dis. Bul., vol. 21, No. 1, Jun. 1978, pp. 231, 232.

"Merged-Transistor Logic (MTL)-A Low Cost Bipolar Logic Concept", Berger et al., IEEE Jour. of Solid-State Circuits, vol. SC-7, No. 5, Oct. 1972, pp. 340-346.

"Integrated Injection Logic: A New Approach to LSI", by Hart et al., IEEE Journal of Solid-State Circuits, vol. SC-7, No. 5, Oct. 1972, pp. 346-351.

IBM TDB "Restore Circuitry for Bit/Sense System", by S. K. Wiedmann, vol. 13, No. 6, Nov. 1970, pp. 1705-1706.

IEEE Journal of Solid-State Circuits, vol. SC-13, No. 5, "A Fast 7.5 ns Access 1K-Bit RAM for Cache-Memory Systems", by K. Kawarada et al., pp. 656-663.

IEEE Journal of Solid-State Circuits, vol. SC-2, No. 4, Dec. 1967, "Beam-Lead Sealed-Junction Semiconductor Memory with Minimal Cell Complexity", by J. E. Iwersen et al., pp. 196-201.

IEEE Journal of Solid-State Circuits, vol. SC-6, No. 5, Oct. 1971, "Bipolar Dynamic Memory Cell", by H. H. Henn, pp. 297-300.

Electronics, May 2, 1974, "Current Steering Simplifies and Shrinks 1k Bipolar RAM", by J. E. Gersbach, pp. 110-114.

Electronics, vol. 47, No. 5, Mar. 7, 1974, "Pinch Load Resistors Shrink Bipolar Memory Cells", by S. K. Wiedmann, pp. 130-133.

Primary Examiner—Terrell W. Fears
Attorney, Agent, or Firm—Wesley DeBruin

[57] ABSTRACT

Semiconductor storage in which the current necessary for reading and/or writing the storage cells is generated simply by discharging input capacitances of the non-selected storage cells and is fed directly to the selected storage cells for reading and/or writing.

15 Claims, 3 Drawing Figures

METHOD OF AND CIRCUIT ARRANGEMENT FOR READING AND/OR WRITING AN INTEGRATED SEMICONDUCTOR STORAGE WITH STORAGE CELLS IN MTL (I²L) TECHNOLOGY

Field of the Invention

The invention relates to the circuitry of a monolithic memory employing Merged Transistor Logic (MTL), or Integrated Injection Logic (I²L), memory cells and a method of reading, or writing information into, or from the memory.

A method of reading and writing the integrated semiconductor store (the storage cells of which comprise flip-flops with bipolar transistors in MTL technology) wherein the line capacitances are discharged during or prior to a read and write operation, respectively, and a read/write circuit is provided. The method is further characterized in that the current necessary for reading and/or writing the storage cells is generated simply by discharging input capacitances of the non-selected storage cells and is fed directly to the selected storage cells for reading and/or writing.

CROSS REFERENCES TO RELATED PATENT APPLICATIONS

U.S. patent application Ser. No. 101,366 entitled "Method and Circuit Arrangement For Controlling An Integrated Semiconductor Memory" filed Dec. 7, 1979 by K. Heuber and S. K. Wiedmann, and of common assignee herewith.

BACKGROUND OF THE INVENTION AND PRIOR ART

U.S. Pat. No. 3,643,231 entitled "Monolithic Associative Memory Cell" granted Feb. 15, 1972 to F. H. Lohrey and S. K. Wiedmann, and of common assignee herewith. The Lohrey et al patent discloses an associative memory storage cell having two cross-connected transistors with the word line for the cell connected to the common emitters of the two transistors and having each of the bases of the two transistors connected to the base of an input/output transistor. The emitter of each of these input/output transistors is connected to a separate bit line and the collectors of the input/output transistors are connected together and to the associative sense amplifier. To associatively search the memory, one of the bit lines is lowered. This causes the input/output transistor connected to the lowered bit line to conduct and thereby give no-match signal to the associative sense amplifier if its base is connected to the base of the conducting one of the two cross-connected transistors and it causes that transistor to remain nonconductive and thereby give a match signal to the associative sense amplifier if it is connected to the base of the non-conducting one of the two cross-connected transistors.

U.S. Pat. No. 3,736,477 entitled "Monolithic Semiconductor Circuit Concept of High Packing Density" granted May 29, 1973 to H. H. Berger and S. K. Wiedmann and of common assignee herewith. The Berger et al patent discloses a monolithic semiconductor circuit comprising a lateral PNP transistor and an inversely operated vertical NPN transistor. The lateral transistor is formed by a pair of mutually spaced P-type regions diffused in an N-type semiconductor body. The collector region has diffused therein a region of N-type and constituting the collector of the vertical transistor. The semiconductor body constitutes the base region of the lateral transistor and the emitter region of the vertical transistor.

U.S. Pat. No. 3,815,106 entitled "Flip-Flop Memory Cell Arrangement" granted June 4, 1979 to S. K. Wiedmann, and of common assignee herewith. The Wiedmann patent discloses a memory cell arrangement which allows the powering of only two row cells at any one time. This results in lower power dissipation in the cells and also permits the driving circuits to operate at a much lower power level, thereby further reducing the power dissipation per chip.

U.S. Pat. No. 3,816,758 entitled "Digital Logic Circuit" granted June 11, 1974 to H. H. Berger and S. K. Wiedmann, and of common assignee herewith. The Berger et al patent discloses a digital logic circuit comprising a first transistor of a predetermined conductivity type and having an emitter, a base and a collector, a second transistor of the opposite conductivity type and having an emitter, a base and a collector, an input adapted to receive a digitial logic signal, an output, a current source, means connecting said first transistor emitter to said current source, means connecting said first transistor base to said second transistor emitter, means connecting said first transistor collector and said second transistor base to said input, and means connecting said second transistor collector to said output.

U.S. Pat. No. 3,886,531 entitled "Schottky Loaded Emitter Coupled Memory Cell For Random Access Memory" granted May 27, 1975 to J. L. McNeill. The McNeill patent discloses a memory cell for a random access memory, the cell including a bistable circuit having first and second cross-coupled transistors with plural emitters. One emitter of each of the first and second transistors is coupled in common. The collector loads for the first and second transistors are provided by respective Schottky diodes which enable the differential voltage in the memory cell to remain low and the cell to be unsaturated over an order of magnitude of current increase to provide for a higher ratio of cell read current to cell store current. Additionally, hard saturation of the memory cell which would otherwise increase the write time is eliminated by this construction.

U.S. Pat. No. 3,993,918 entitled "Integrated Circuits" granted Nov. 23, 1976 to A. W. Sinclair. The Sinclair patent discloses a master/slave bistable arrangement which operates on current levels rather than voltage levels and with a single input of clock pulses. There are different bias current levels which are advantageously supplied by multi-layer current injection structures in integrated form.

U.S. Pat. No. 4,021,786 entitled "Memory Cell Circuit and Semiconductor Structure Therefore" granted May 3, 1977 to H. W. Peterson. The Peterson patent discloses a memory cell which comprises a word line, a pair of bit lines, a pair of current sources each having a first side coupled to a corresponding one of the bit lines; and a bistable circuit means operatively coupled to the word line and to another side of each of the current sources, whereby the bistable circuit means assumes one stable state upon the application of a voltage on one bit line, and assumes another stable state upon the application of a voltage on the other bit line.

U.S. Pat. No. 4,090,255 entitled "Circuit Arrangement For Operating A Semiconductor Memory System" granted May 16, 1978 to H. H. Berger et al., and of common assignee herewith. The Berger et al patent discloses a circuit arrangement for operating the read/write cycles of an integrated semiconductor memory storage system whose storage cells consist of flip flops with bipolar switching transistors, Schottky diodes as read/write elements coupling the cell to the bit lines, and high-resistivity resistors, or transistors controlled as current sources, as load elements, in several phases. This is accomplished through coupling the storage cell to both read/write circuits and restore/recovery circuits via the bit lines and by selective pulsing of the cell with the read/write circuits and the restore/recovery circuits. This permits high speed, low operating current, large scale memory systems to be built.

IBM Technical Disclosure Bulletin publication entitled "MTL Storage Cell" by S. K. Wiedmann, Vol. 21, No. 1, June 1978, pages 231-2.

"Merged-Transistor Logic (MTL)—A Low-Cost Bipolar Logic Concept" by Horst H. Berger and Siegfired K. Wiedmann, IEEE Journal of Solid-State Circuits, Vol. SC-7, No. 5, Oct. 1972, pages 340-6.

"Integrated Injection Logic: A New Approach to LSI" By Kees Hart and Arie Slob, IEEE Journal of Solid-State Circuits, Vol. SC-7, No. 5, October 1972, pages 346-51.

From U.S. Pat. No. 4,090,255 a method and a circuit arrangement for driving an integrated semiconductor storage are known, the storage cells of which consist of flip-flops with bipolar transistors and Schottky diodes as read/write coupling elements and the load elements of which are high-ohmic resistors or transistors connected in the form of current sources. The read/write cycles of the storage cells, which are performed in several phases, are selected by level changes on the word and bit lines. For increasing the read and write speed as well as for reducing the power dissipation, the bit lines are discharged via the conductive storage cell transistors. Discharging of the bit lines via these conductive storage cell transistors is effected to ground. During the read phase of the storage, the bit lines are only slightly recharged, so that the recharge current flowing through the storage cell is very low.

In the past few years, there have been many developments in the field of logic arrays and integrated semiconductor storage technology with bipolar transistors, which are referred to as MTL (Merged Transistor Logic) or I²L (Integrated Injection Logic) in the specialized literature. In this connection, attention is drawn, for example, to the articles in the IEEE Journal of Solid State Circuits, Vol. SC/7, No. 5, October 1972, pp. 340 ff. and 346 ff. Corresponding proposals are also contained in U.S. Pat. No. 3,736,477 as well as U.S. Pat. No. 3,816,748.

These concepts with bipolar transistors have short switching times and are particularly suitable for extremely highly integrated storages and logic circuit groups.

Storages with storage cells of bipolar transistors having a structure resembling that of MTLs necessitate a recharging of bit data and/or control line capacitances for selecting a storage cell. For this purpose, the voltage swing of the bit lines approximately corresponds to the voltage swing of the selected word lines. As previously described in U.S. Pat. No. 4,090,255, the capacitive discharge currents are discharged to ground via the storage cells of the selected word line and via the word line driver. With a greater number of storage cells in a matrix this has the disadvantage that the area requirements of the driver switching circuits, the power dissipation for each driver, and the delay period occurring during the selection of the word line increase disproportionately, so that the advantages of the MTL structure employed would be eliminated.

To avoid this disadvantage, German Offenlegungsschrift No. 28 55 866 proposes a method of driving a semiconductor storage and a circuit arrangement. [German Offenlegungsschrift No. 28 55 866 corresponds to U.S. patent application Ser. No. 101,366, entitled "Method and Circuit Arrangement For Controlling An Integrated Semiconductor Memory" filed Dec. 7, 1979 by Klaus Heuber and Siegfried Kurt Wiedmann]. This method is characterized in that in due time prior to selection, a control arrangement known per se generates control signals for the storage matrix as a function of a selection signal. These control signals are simultaneously applied to a discharge circuit, common to all storage cells, and to switching transistors which are thus switched on. As a result, the discharge currents of the line capacitances on the bit data and control lines flow through the switching transistors, being jointly discharged via the discharge circuit. This circuit arrangement is characterized in that the bit lines within the storage matrix are connected to a discharge line which, in turn, is connected to a discharge circuit, and that for control purposes, the discharge circuit and all word and/or bit line switching transistors are connected via lines to a control logic controlled by the selection signal of the storage chip.

Although these discharge methods as well as the circuit arrangements for implementing them, in addition to preventing capacitive peak currents on the voltage supply lines and permitting a relatively high degree of integration, permit using the minimum voltage swing on the word line, these solutions have the following disadvantages:

The discharge operation and the selection operation of the bit lines must be performed consecutively. The rise in the sensing current from the sensing circuit after selection of the bit lines decisively determines the access time to the storage cell. The bit and word line switching transistors operating parallel to each other must be switched on at the end of the selection period, so that the access time to the storage chip is prolonged.

The number of components required in the peripheral circuits of such a storage are, however, very great. In addition, the read signal supplied depends on the direct current emanating from the read/write amplifier.

SUMMARY OF THE INVENTION

Therefore, it is the object of the invention to provide a method for reading and/or writing an integrated semiconductor store, the storage cells of which, designed in particular in MTL technology and arranged at the crossing points of word and bit lines, are selected via drivers and decoders, and which has a higher and steeper read/write signal, fewer components in the read/write circuits, and fewer control lines, as well as a circuit arrangement for implementing the method.

The method in accordance with the invention is characterized in that the line capacitances are discharged during or prior to a read and write operation, respectively, and a read/write circuit is provided. The method in accordance with the invention is further characterized in that the current necessary for reading and/or writing the storage cells is generated simply by discharging input capacitances of the non-selected storage cells and is fed directly to the selected storage cells for reading and/or writing.

The method in accordance with the invention is still further characterized in that by the read or write signal the discharging of the bit line capacitances is initiated, and that the bit line discharge currents are used to read and/or write a selected storage cell of the respective bit line pair.

The method in accordance with the invention yet further characterized in that the discharge currents are from the bit line and injector depletion layer capacitances of the selected storage cell, and that the discharging of these diffusion capacitances on the OFF state side (NPN transistor "OFF") is effected at a considerably higher speed than on the ON state side (NPN transistor "ON"), and that the read signal is the differential signal resulting from the charges on the input and output sides which are discharged at different speeds.

The invention is further characterized by a circuit arrangement for practicing the method in accordance with the invention. The circuit arrangement is characterized by memory cells in MTL (or I²L) technology and in that for each bit line pair two Schottky-clamped transistors with Schottky collector contacts are connected to the bit lines and that the bases of the Schottky-clamped transistors are connected to read/write lines, respectively, and the emitters are jointly connected to a bit selection line.

The method in accordance with the invention has the advantage that the read signal, which is marked by a considerably greater edge steepness and a much higher absolute magnitude, is considerably improved.

In addition, the number of components in the read/write circuit associated with each bit line pair are considerably reduced, since in this case components for providing a sensing current and/or a direct current for writing are no longer required. The number of control lines for the components within the read/write circuit are considerably reduced. Spurious injection currents through the insulation between selected and non-selected cells are considerably reduced, since the new circuit operates at lower currents. With regard to the voltage levels on the read/write and the bit lines, the new read/write circuit is extremely uncritical, as the two transistors still existing and which are used for writing are never inversely switched on, since they are blocked by Schottky diodes.

BRIEF DESCRIPTION OF THE DRAWINGS

These and other objects, features and advantages of the invention will be apparent from the following more particular description of the preferred embodiment of the invention as illustrated in the drawings.

The invention will be described in detail below by means of an embodiment shown in the accompanying drawings.

Figure 1:
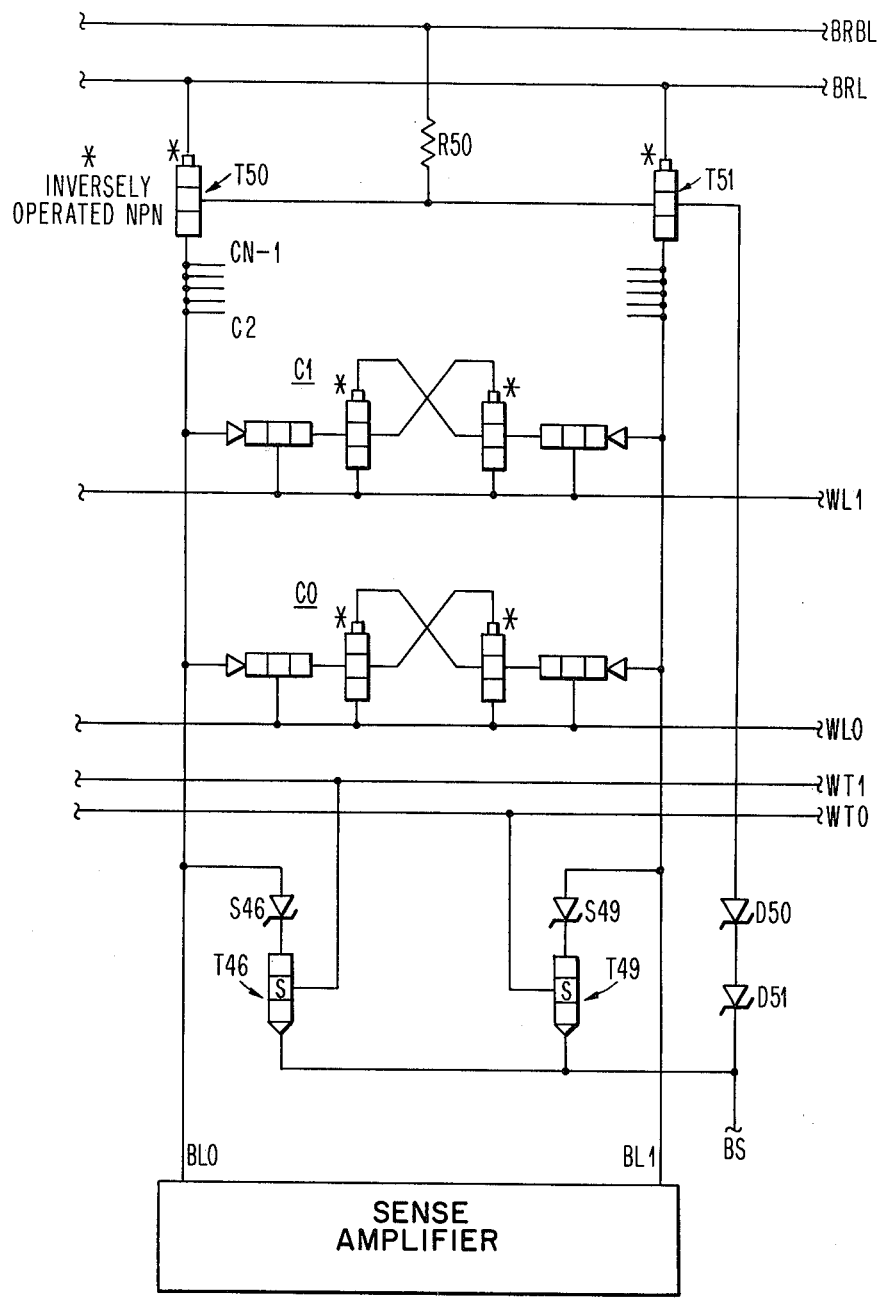
FIG. 1 is a sectional view of a storage plane with the read/write circuit in accordance with the invention.

The circuit diagram of FIG. 1 shows a section of a storage plane in integrated technology. In the lower part of the circuit arrangement the new read/write amplifier is shown. It consists of the two Schottky-clamped transistors T46 and T49 with the Schottky collector contacts S46 and S49, respectively. The base of the transistor T46 is connected to a line WT1 which is used in common by all read/write amplifiers of a storage plane. The base of the transistor T49 is connected to a line WT0 which is also used in common by all read/write amplifiers of a storage plane. Via a common line, the emitters of the two transistors T46 and T49 are connected to a bit selection line BS which is connected to the base of one bit switch T51 via two series-connected Schottky diodes D50 and D51. This transistor T51 constituting the bit switch for the bit line BL1 is connected to the bit line BL1, transistor T50 being connected to the bit line BL0, while the other electrode of both transistors is connected to a bit reference line BRL on the storage plane. Via a resistor R50, connected to a further reference line BRBL, the bases of both transistors T50 and T51 are provided with a current which keeps the transistors saturated during standby.

In the center part of FIG. 1 the two storage cells C0 and C1 are shown in a bit line pair BL0, BL1. The horizontal lines above the storage cell C1 are to indicate that in practice N storage cells are arranged within said bit line pair BL0, BL1.

For each storage cell C0, C1, ..., FIG. 1 also shows word lines WL, of which in this circuit diagram only the word lines WL0 and WL1 for the storage cells C0 and C1 are represented. It is pointed out that a known differential amplifier, not shown, which is common to all cells in a bit line pair BL0, BL1, is connected to the bit lines BL0 and BL1 for sensing the stored information. The Schottky diodes D50, D51 and the resistor R50 serve to provide and set in a known manner the standby and operating potentials during the individual storage operations.

Figure 2:
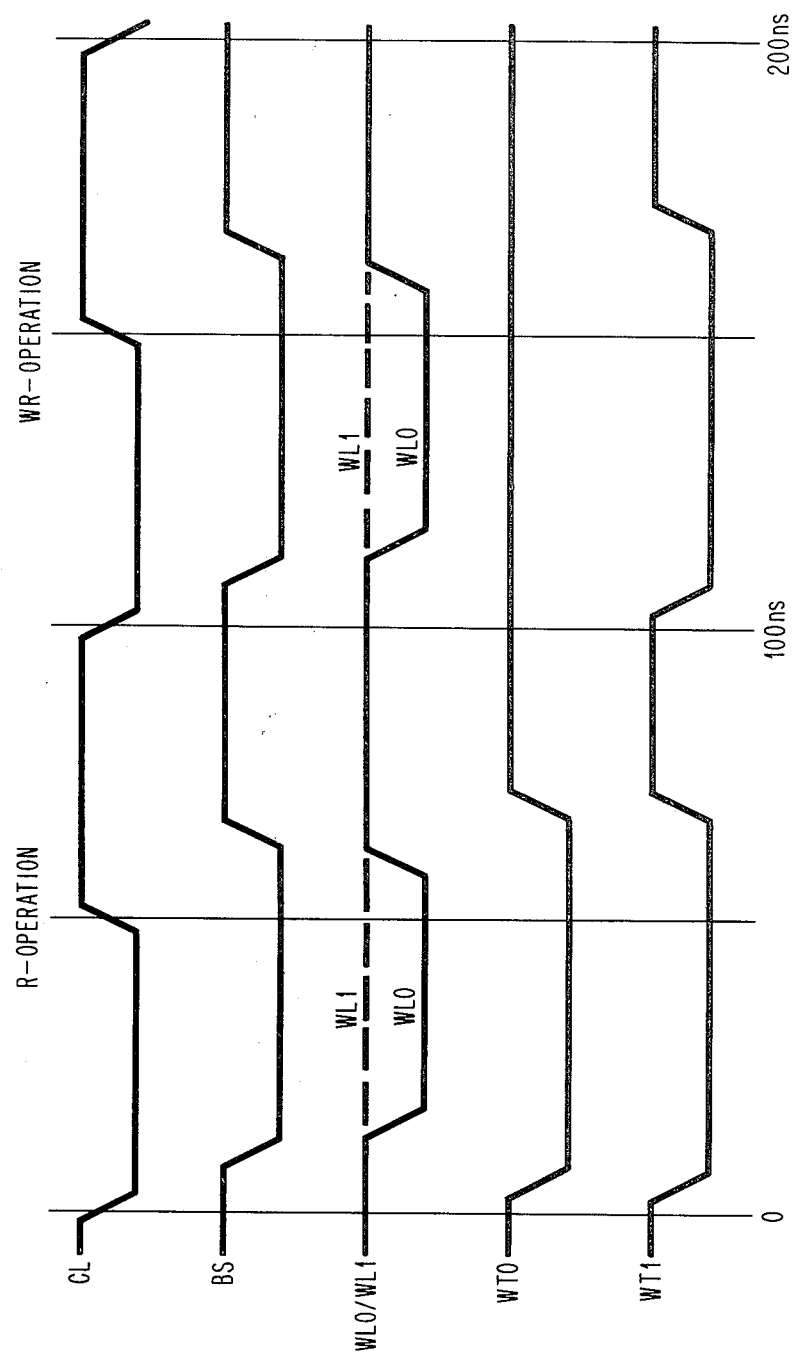
FIG. 2 is a time diagram for the read and write operations performed in the circuit arrangement of FIG. 1.

By means of the time diagram of FIG. 2, the function of the circuit diagram of FIG. 1 will be described in detail below for one read and write cycle each, referred to as R and WR operation, respectively.

Initially, it is assumed that the storage is in the standby state, i.e., all potentials and currents are set in such a manner that the power dissipation is only very low. The currents for the bit lines BL0 and BL1 are supplied via the transistors T50 and T51 serving as bit line line switches. These two transistors T50 and T51 are inversely operated and highly saturated, thus ensuring that the bit line potentials VBL0 and VBL1 differ only slightly from each other (typically, under the most critical conditions, by 3mV for a stored bit pattern). The word line potentials VWL0, VWL1, ..., VWL (N−1) are by VBE (typically 600 mV) below the bit line potential.

It is assumed below that the storage cell C0 of FIG. 1 is to be selected for a subsequent read operation. The bitside selection of the storage cell C0 is effected by pulling down the potential on the line BS (see time diagram of FIG. 2). This leads to the two transistors T50 and T51, serving as bit line switches, being switched off and the standby current being interrupted. The storage cell C0 of FIG. 1 is selected on the wordside by lowering the potential on word line WL0.

Figure 3:
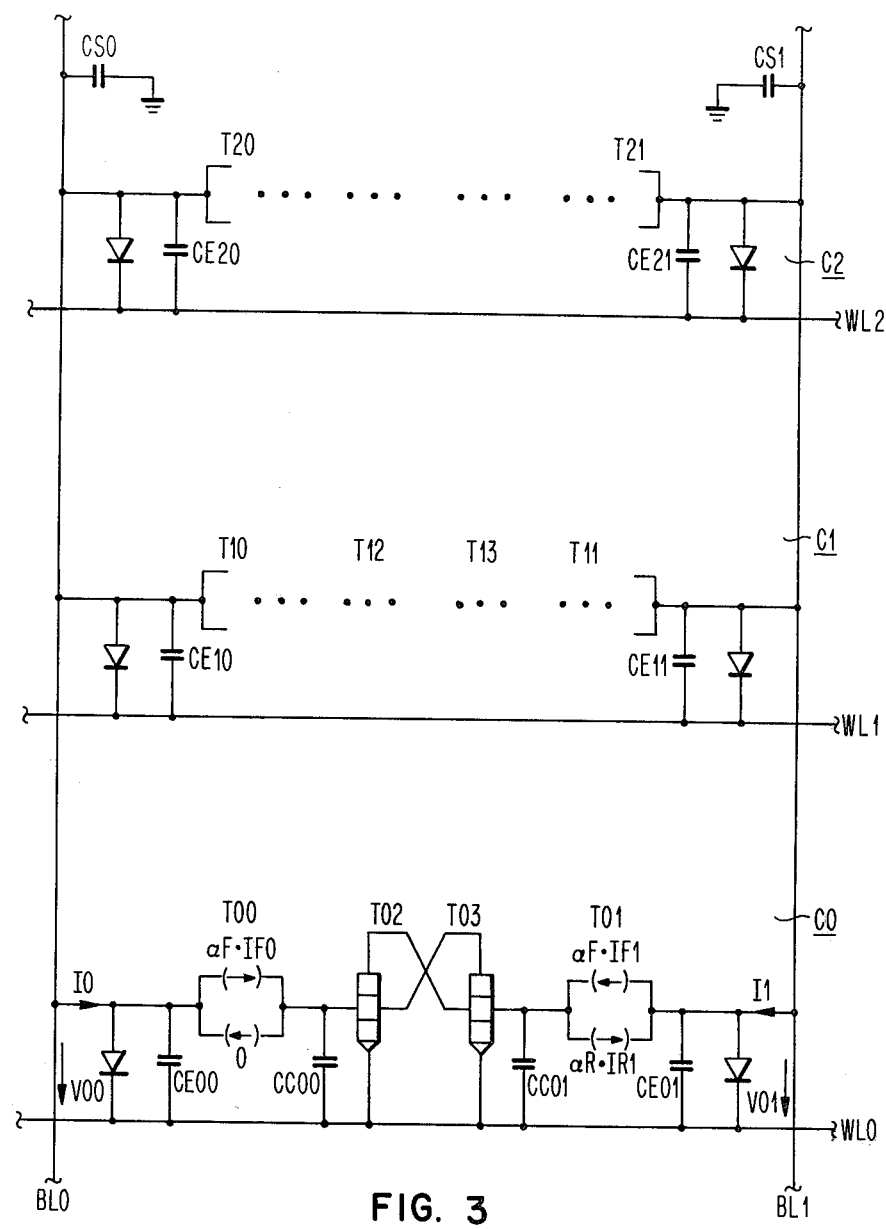
FIG. 3 is a detailed equivalent circuit diagram of the storage cells in a column of the storage plane.

If the potential on the word line WL0 is abruptly pulled down, the parallel-connected injector capacitances of the non-selected cells and the bit line metal capacitances CS0 and CS1

$$CBL0 = CE10 + CE20 + \ldots + CE(N-1)0 + CS0$$

$$CBL1 = CE11 + CE21 + \ldots + CE(N-1)1 + CS1$$

together with the injector capacitances CE00 and CE01 of the selected storage cell C0 form a capacitive voltage divider, as shown in FIG. 3.

A charge ΔQ, in the form of pulses, flows into the two input capacitances CE00 and CE01, thus increasing the injector voltages of the selected storage cell C0. Analyses during practical tests showed that at a word line swing of $$\Delta VWL \approx 400 \text{ mV}$$

the injector capacitances are charged by $$\Delta Q \approx 1 \text{ pAs}$$

at an increase of the injector voltages by $$\Delta V \approx 230 \text{ mV}.$$

The mean charges ΔQ flowing into the injectors during the clock cycle tCL=50 ns correspond to an average read current of I0=I1=ΔQ/tCL ($\approx 20 \mu A$).

The balancing process for ΔQ after the potential on the word line, for example WL0, has been pulled down is extremely complex and will be described in detail below by means of FIG. 3.

Initially, the discharge currents injected from the injector capacitances CE00 and CE01 to the inner cell nodes lead to a charging of the illustrated capacitances CC00 and CC01. During this, the base emitter voltage of both NPN transistors T02 and T03 increases. On the OFF state side of the storage cell C0, in this case transistor T02, the voltage, starting at about 20 mV, reaches a value of about 400 mV for a short time, to subsequently drop very rapidly if the base emitter capacitance CC01 of the transistor T03 is charged to such an extent that the discharge current on the OFF state side of the storage cell C0 is taken over.

On the ON state side, i.e., in FIG. 3 at transistor T03, the voltage rises from about 600 mV to about 800 mV, to subsequently drop slowly.

The read signal is derived from the different decrease in the charges of the OFF and ON state storage cell C0. The discharge current on the OFF state side is the collector current of the ON state NPN transistor T03. Discharging proceeds very rapidly. On the ON state side this corresponds to the base current of the ON state NPN transistor T03. This current is lower than the collector current by the current amplification βu. The part of ΔQ not discharged by the base current remains as a storage charge in PNP transistor T01 on the ON state side. This part drops at the storage time constant TS, which generally is about 30 ns. A higher injector voltage corresponds to the greater charge on the ON state side.

This shows that the stored information in the storage cell C0 can only be read by means of the capacitive currents on the bit lines BL0 and BL1, i.e., without any additional currents being generated by the read/write circuit.

For the sake of completeness, FIG. 3 also shows the spare components of the storage cells C1 and C2. The write operation and the currents occurring during this operation will be described briefly below.

For writing, one of the two transistors T46 and T49, respectively, in the read/write circuit is activated, i.e., it is switched to the ON state. In other words, the bit line BL0 is discharged when the transistor T46 is switched on, and the bit line BL0 is discharged when the transistor T49 is in the ON state. At the respective input capacitance of the storage cell C0 connected to the bit line BL0 or BL1 the charge Q is generated when the word line potential VWL0 is lowered as during reading. If at that point in time the current flowing into the collector can no longer be taken over by the ON state transistor, because the PNP transistor integrated with it ceases to supply base current, the storage cell changes to its other state, i.e., the binary zero or one required is written in.

In this case, too, it has been shown quite clearly that, apart from the capacitive currents for writing information into the storage, no further currents are required and that it is this very fact that permits fast and accurate switching. The circuit diagram of FIG. 1 also shows quite clearly that the technical means required for the read/write circuit are only very few if capacitive currents are used to read and/or write information. A further advantage is that few control lines are required, so that a very high integration density is obtained.

The driver and decoder circuits on the bit- and word-side, respectively, are neither shown nor will they be described, because they are known from the art and need not be explained for the purpose of the present invention.

While the invention has been shown and described with reference to a preferred embodiment thereof it will be understood by those skilled in the art that various changes in form and details may be made therein without departing from the spirit and scope of the invention.

We claim:

1. A method of reading and writing an integrated semiconductor store, said store having storage cells which consist of flip-flops with bipolar transistors in MTL technology, wherein line capacitances are discharged during or prior to a read and write operation, respectively, and a read/write circuit is provided, said method being characterized in that the current necessary for reading and/or writing the storage cells (C) is generated simply by discharging input capacitances (CE) of the non-selected storage cells and is fed directly to the selected storage cells (C) for reading and/or writing.

2. A method of reading and writing an integrated semiconductor store, as recited in claim 1, further characterized in that by a read and/or write signal the discharging of the bit line capacitances is initiated, and that the bit line discharge currents are used to read and/or write a selected storage cell of the respective bit line pair (BL0, BL1).

3. A method of reading and writing an integrated semiconductor store, as recited in claim 1 or claim 2, further characterized in that the discharge currents from bit lines and injector depletion layer capacitances charge injector diffusion capacitances of the selected storage cell (C), and that the discharging of these diffusion capacitances on the OFF state side (NPN transistor "OFF") is effected at a considerably higher speed than on the ON state side (NPN transistor "ON"), and that the read signal is the differential signal resulting from the charges on the input and output sides, which are discharged at different speeds.

4. A circuit arrangement for reading or writing information into an integrated semiconductor store having storage cells in MTL or I²L technology, said circuit arrangement being characterized by two Schottky-clamped transistors (T46 and T49) with Schottky collector contacts (S46 and S49) connected to the bit lines (BL0 and BL1), the bases of the Schottky-clamped transistors (T46 and T49) are respectively connected to a read/write lines (WT1 and WT0), and the emitters are jointly connected to a bit selection line (BS).

5. In a solid state memory wherein reading or writing information into a selected memory cell is accomplished by utilizing the capacitively stored energy in a plurality of non-selected memory cells, said solid state memory including:
 a first potential source;
 a second potential source;
 first and second transistors of a first conductivity type, said first and second transistors each having an emitter, base and collector;
 resistance means connecting said base of said first transistor in common with said base of said second transistor to said first potential source;
 passive means connecting said collector of said first transistor in common with said collector of said second transistor to said second potential source;
 a first bit line connected to said emitter of said first transistor;
 a second bit line connected to said emitter of said second transistor;
 n word lines;
 n memory cells, each of said n memory cells being connected to said first and second bit lines and to a predetermined one of said n word lines, each of said n memory cells having first and second stable states of conductivity;
 each said memory cell comprising, third and fourth transistors of said first conductivity type, fifth and sixth transistors of a second conductivity type, said third, fourth, fifth and sixth transistors each having an emitter, base and collector, said emitter of said fifth transistor being connected to said first bit line, said emitter of said sixth transistor being connected to said second bit line, said base of fifth transistor, said emitter of said third transistors, said emitter of said fourth transistor and said base of said sixth transistor being connected in common to said predetermined one of said n word lines, said collector of said fifth transistor, said base of said third transistor and said collector of said fourth transistor being connected in common, said collector of said sixth transistor, said base of said fourth transistor and said collector of said third transistor being connected in common;
 and, read/write control means connected to said first and second bit lines and to said first and second transistors.

6. In a solid state memory wherein reading or writing information into a selected memory cell is accomplished by utilizing the capacitively stored energy in a plurality of non-selected memory cells, as recited in claim 5, wherein said read/write control means includes:
 a read/write control line;
 a write "1" control line;
 a write "0" control line;
 seventh and eighth transistors of said first conductivity type, said seventh and eighth transistors each having an emitter, base and collector, said base of said seventh transistor being connected to said write "1" control line, said base of said eighth transistor being connected to said write "0" control line, said emitter of said seventh transistor and said emitter of said eighth transistor being connected in common to said read/write control line; and,
 first and second Schottky diodes, said first Schottky diode being connected between said collector of said seventh transistor and said first bit line, and said eighth Schottky diode being connected between said collector of said eighth transistor and said second bit line.

7. In a solid-state memory wherein reading or writing information into a selected memory cell is accomplished by utilizing the capacitively stored energy in a plurality of non-selected memory cells, as recited in claim 6, wherein said read/write controls is connected to said base of said first transistor and said base of said second transistor by Schottky diode circuit means.

8. In a solid-state memory wherein reading or writing information into a selected memory cell is accomplished by utilizing the capacitively stored energy in a plurality of non-selected memory cells, as recited in claim 7, wherein said Schottky diode circuit means comprises serially connected third and fourth Schottky diodes.

9. In a solid-state memory wherein reading or writing information into a selected memory cell is accomplished by utilizing the capacitively stored energy in a plurality of non-selected memory cells, as recited in claim 8, wherein read/write sense amplifier means is connected to said first and second bit lines.

10. In a solid-state memory having an array of m×n memory cells, where m and n are respectively positive integers, said array of m×n memory cells having m columns of memory cells and n rows of memory cells, m pairs of bit lines, each of said m pairs of bit lines consisting of a first bit line and a second bit line, each of said m pairs of bit lines being associated with a predetermined one of said m columns of memory cells, n wordlines, each of said n wordlines being associated with a predetermined one of said n rows of memory cells, said solid state memory comprising:
 m×n memory cells, each said memory cell including first, second, third and fourth transistors, each of said transistors having an emitter, base and collector, said first and second transistors being PNP type transistors, said third and fourth transistors being NPN type transistors, said emitter of said first transistor being connected to a predetermined one of said first bit lines, said collector of said first transistor being connected to said base of said third transistor and said collector of said fourth transistor, said collector of said third transistor being connected to said base of said fourth transistor and said collector of said second transistor, said emitter of said second transistor being connected to a predetermined one of said second bit lines, said base of said first transistor, said base of said second transistor, said emitter of said third transistor and said emitter of said fourth transistor being connected in common to a predetermined one of said n word lines;
 m pairs of bit line switches, each pair of said m pairs of bit line switches consisting of a first bit line switch and a second bit line switch, each of said first bit line switches of said m pairs of bit line switches being connected between a predetermined one of said first bit lines of said m pairs of bit lines and a source of reference potential, each of said second bit line switches of said m pairs of bit line switches being connected between a predetermined one of said second bit lines of said m pairs of bit lines and said source of reference potential;

m read/write amplifier and control circuit means, each of said m read/write amplifier and control circuit means being associated with a predetermined one of said m columns of memory cells, each of said m read/write amplifier and control circuit means being connected to a predetermined pair of said m pairs of bit lines, and each of said m read/write amplifier and control circuit means being connected to a predetermined pair of said m pairs of bit line switches.

11. In a solid-state memory, as recited in claim 10 wherein each of said bit line switches of said m pairs of bit line switches comprises a single transistor and each of said m read/write amplifier and control circuit means comprises two transistors and four Schottky diodes.

12. A method for reading information stored in a memory cell of a solid-state memory having a plurality of memory cells, each of said cells comprising bipolar transistors in merged transistor logic (MTL) technology, said method including the following steps:
(a) select a memory cell to be read;
(b) actuate bit line switches to discharge capacitively stored energy in bit lines and input capacitances of non-selected cells; and
(c) utilize said capacitively discharged energy to read the information stored in said selected memory cell.

13. A method for writing information into a memory cell of a solid-state memory having a plurality of memory cells, each of said cells comprising bipolar transistors in Merged Transistor Logic (MTL) technology, said method including the following steps:
(a) select a memory cell to be written into;
(b) actuate bit line switches to discharge capacitively stored energy in bit lines and input capacitances of non-selected cells; and
(c) utilize said capacitively discharged energy to write the information into said selected memory cell.

14. A method for reading information stored in a selected group of memory cells of a solid state memory having a plurality of groups of memory cells, each of said memory cells comprising bipolar transistors in merged transistor logic (MTL) technology, said method including the following steps:
(a) select a group of memory cells to be read;
(b) discharge capacitively stored energy in bit lines and non-selected groups of memory cells; and
(c) utilize said capacitively discharged energy to read the information stored in said selected group of memory cells.

15. A method for writing information into a selected group of memory cells of a solid state memory having a plurality of groups of memory cells, each of said memory cells comprising bipolar transistors in merged transistor logic (MTL) technology, said method including the following steps:
(a) select a group of memory cells to be written into;
(b) discharge capacitively stored energy in bit lines and non-selected groups of memory cells; and
(c) utilize said capacitively discharged energy to write the information into said selected group of memory cells.

* * * * *